(12) United States Patent
Fritsch et al.

(10) Patent No.: US 6,259,021 B1
(45) Date of Patent: Jul. 10, 2001

(54) HOUSING FOR AN ELECTRIC APPLIANCE

(75) Inventors: Thomas Fritsch, Eppstein; Karl Herzog, Frankfurt; Gerhard Kressner, Altenstadt, all of (DE)

(73) Assignee: Braun GmbH (DE)

( * ) Notice: Subject to any disclaimer, the term of this patent is extended or adjusted under 35 U.S.C. 154(b) by 0 days.

(21) Appl. No.: 09/494,587

(22) Filed: Jan. 31, 2000

Related U.S. Application Data

(63) Continuation of application No. PCT/EP98/03886, filed on Jun. 25, 1998.

(30) Foreign Application Priority Data

Aug. 1, 1997 (DE) ................................ 197 33 361

(51) Int. Cl.$^7$ ....................................................... H01J 5/00
(52) U.S. Cl. .............................. 174/50; 174/66; 220/3.8; 220/241; 362/202
(58) Field of Search ....................... 174/50, 66; 220/241, 220/3.8; 362/202

(56) References Cited

U.S. PATENT DOCUMENTS

| 1,955,511 | * | 4/1934 | Muros | 362/202 X |
|---|---|---|---|---|
| 4,388,673 | * | 6/1983 | Maglica | 362/202 X |
| 4,796,842 | | 1/1989 | Hamada et al. | 248/186 |
| 4,886,938 | | 12/1989 | Rottmar et al. | 174/52.1 |
| 5,256,953 | | 10/1993 | Cimbal et al. | 320/2 |
| 5,660,458 | * | 8/1997 | Chabria | 362/202 X |

FOREIGN PATENT DOCUMENTS

| 79 05 922 U | 6/1979 | (DE) | H01M/2/10 |
|---|---|---|---|
| 37 06 983 C2 | 9/1987 | (DE) | H04N/5/64 |
| 36 14 198 A1 | 10/1987 | (DE) | H02G/15/06 |
| 92 14 413.6 U | 2/1993 | (DE) | B62K/19/30 |
| 42 34 962 A1 | 4/1994 | (DE) | G12B/9/04 |

OTHER PUBLICATIONS

PCT International Search Report, dated Nov. 23, 1998, in corresponding International Application PCT/EP98/03886.

* cited by examiner

Primary Examiner—Dean A. Reichard
Assistant Examiner—Dhiru Patel
(74) Attorney, Agent, or Firm—Edward S. Podszus

(57) ABSTRACT

The invention is directed to a housing, in particular for an electric appliance, having a housing part (1) with a noncircular cross section closed by a detachable housing bottom (3). The housing bottom (3) includes an outer bottom (4) and an inner bottom (5) mounted for rotation in the outer bottom (4). In a closed condition, the inner bottom (5), the housing part (1) and the outer bottom (4) are joined together in particular by positive engagement.

39 Claims, 1 Drawing Sheet

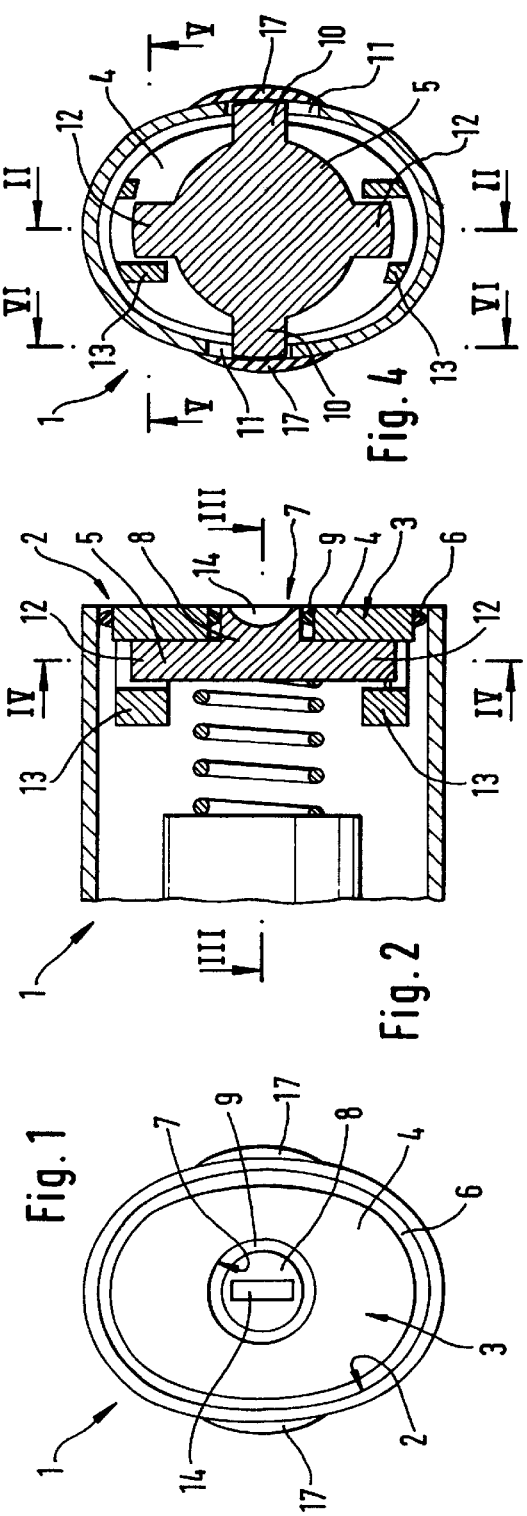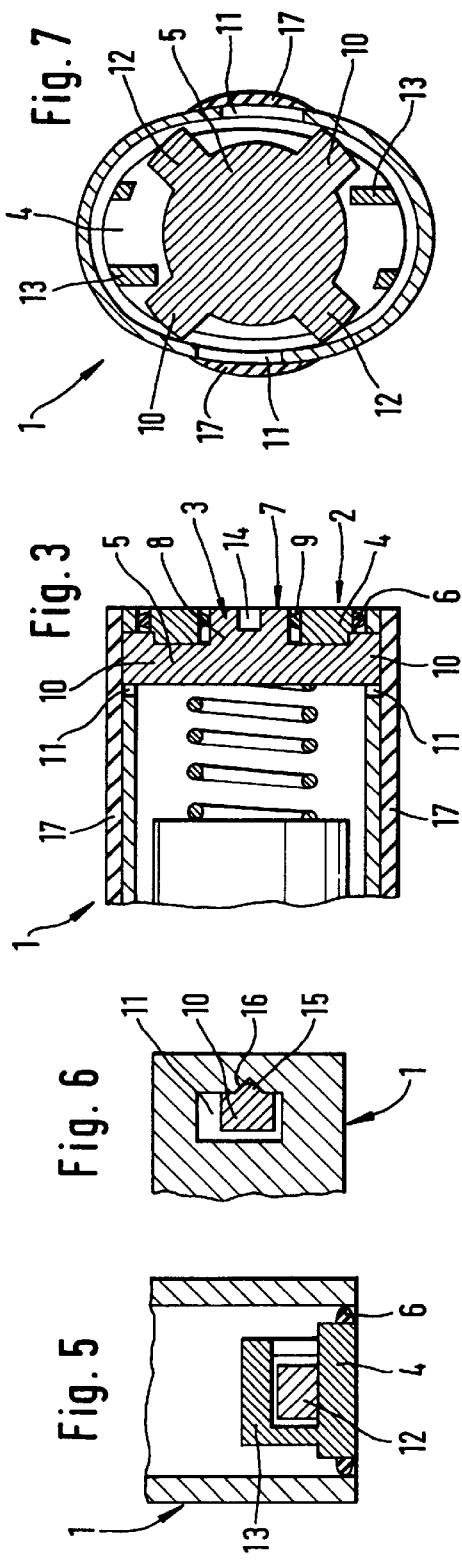

HOUSING FOR AN ELECTRIC APPLIANCE

This is a continuation of International Application PCT/EP98/03886, co-pending, with an International filing date of Jun. 25, 1998.

This invention relates to a housing, in particular for an electric appliance, having a housing part with a noncircular cross section closed by a detachable housing bottom.

Cylindrical housing parts closed by a circular housing bottom with a thread or the like are already known. To open the housing part the housing bottom is first transferred into an open state by the user turning it and is then removed from the housing part. In the case of an electric appliance, for example, the user can then replace empty batteries.

In the case of noncircular housing parts, other devices are known with which the likewise noncircular housing bottom is detachably fastened to the housing part. For example, the housing bottom can be inserted in the housing part and locked there. Inserting and locking the housing bottom in this way is often associated with difficulties for the user, particularly when compared to the simple operation of screwing the housing bottom in and out as described above.

SUMMARY OF THE INVENTION

Proceeding from this realization, it is an object of the present invention to provide a housing with a noncircular housing part, having a housing bottom which is easy to open and close by a user.

In a housing of the type initially referred to, this object is accomplished in accordance with the invention in that the housing bottom is comprised of an outer bottom and an inner bottom rotatably mounted in the outer bottom.

With the aid of the rotatable inner bottom the housing bottom can be opened and closed by the user in simple manner. The complicated insertion of the housing bottom in the housing part is unnecessary. Thanks to the invention the user is thus able to handle the noncircular housing bottom in the same way in which he is accustomed with a circular housing bottom. The opening and closing of the housing part to replace batteries, for example, is thus made far simpler and hence easier for the user.

In an advantageous further aspect of the invention, the outer contour of the outer bottom has roughly the inner contour of the housing part's noncircular cross section. The outer bottom forming an outer surface of the housing has the job of covering that opening in the housing part which needs to be closed. It is not the job of the outer bottom to lock with the housing part or to turn. Hence the outer bottom can be particularly well adapted to the housing part.

In a further advantageous configuration of the invention the outer bottom has a circular opening into which the inner bottom extends, and the outer contour of the inner bottom has roughly the inner contour of the circular opening in the outer bottom. Hence the opening in the outer bottom is filled by the inner bottom. On the whole, the outer surface in the area of the housing bottom is thus formed by the outer bottom and the emerging projection of the inner bottom. In this emerging projection the inner bottom is provided, for example, with a slot or the like. This slot enables the user to turn the inner bottom in simple manner, transferring the entire housing bottom from a closed state into an open state.

In an advantageous embodiment of the invention in the closed state the inner bottom, the housing part and the outer bottom are joined together in particular by positive engagement. This represents a simple but secure way to fasten the housing bottom in the housing part. Said closed state can be effected by the user turning the inner bottom and thus establishing the positive engagement relationship. In the open state there is no positive engagement, making it possible for the housing bottom to be removed from the housing part.

Particularly conveniently, the inner bottom has at least one arm which cooperates with a cutout or the like in the interior of the housing part into which the arm engages in the closed state, and furthermore the inner bottom has at least one arm which cooperates with a frame or the like on the outer bottom into which the arm engages in the closed state. These arrangements can be implemented in the design in simple manner yet guarantee a secure positive engagement relationship and hence a durable fastening of the housing bottom in the housing part.

In an advantageous further aspect of the invention the inner bottom, in particular at least one of the arms of the inner bottom, and the housing part are equipped with locking means, particularly with a nose and a cooperating groove. Locking of the inner bottom in the closed state is thus achieved in simple manner. Consequently, the inner bottom is unable to turn by itself into the open state, and the housing bottom is hence unable to detach itself from the housing part without the user's intervention.

In yet another advantageous aspect of the invention a seal is positioned between the housing part and the outer bottom and/or a seal is placed between the outer bottom and the inner bottom. These seals, preferably made of an elastomer material, prevent the ingress of water and/or dirt into the interior of the housing. Suitably, the seals can either be inserted between the components identified or be fitted to at least one of said components in a two-component injection molding process.

In this arrangement it proves an advantage for at least one of the seals to be joined to the housing part and/or to the outer bottom and/or to the inner bottom in a two-component injection molding process.

Finally, there is the advantageous possibility of covering cutouts in the housing part from the outside by a layer of elastomer, the layer being joined to the housing part in a two-component injection molding process.

Further features, application possibilities and advantages of the present invention will become apparent from the subsequent description of embodiments of the present invention illustrated in the Figures of the accompanying drawing. It will be understood that any single feature and any combination of single features described or represented by illustration form the subject-matter of the present invention, irrespective of their summary in the patent claims or their back-reference, as well as irrespective of their wording and representation in the description and the drawing, respectively.

BRIEF DESCRIPTION OF THE DRAWINGS

FIG. 1 is a schematic top plan view of a housing bottom of an embodiment of a housing of the present invention;

FIG. 2 is a schematic longitudinal sectional view of the e housing of FIG. 1, taken along the plane II—II of FIG. 4;

FIG. 3 is a schematic longitudinal sectional view of the housing of FIG. 1, taken along the plane III—III of FIG. 2;

FIG. 4 is a schematic cross–sectional view of the housing of FIG. 1, taken along the plane IV—IV of FIG. 2;

FIG. 5 is a schematic sectional view of the housing of FIG. 1, taken along the plane V—V of FIG. 4;

FIG. 6 is a schematic sectional view of the housing of FIG. 1, taken along the plane VI—VI of FIG. 4; and FIG. 7 is a schematic cross-sectional view of the housing of FIG. 1 in accordance with FIG. 4.

DETAILED DESCRIPTION OF THE PREFERRED EMBODIMENTS

FIGS. 1 to 7 show a housing part 1 of a housing intended for use in particular as the housing of an electric appliance. The housing part 1 (housing piston) is shaped like a cylinder but has a noncircular cross section. The housing part 1 is intended, for example, to accommodate one or more batteries, which are then arranged in longitudinal direction inside the housing part 1.

At its free end the housing part 1 has an opening 2 with an approximately oval inner contour filled by a housing bottom 3. It will be understood, of course, that the inner contour of the opening 2 does not have to be a regular oval but can be any shape, including asymmetrical. The housing bottom 3 is arranged approximately transverse to the longitudinal direction and is detachably connected to the housing part 1. In a closed state the housing bottom 3 covers the opening 2 in the housing part 1, thus closing the housing part 1. In an open state the housing bottom 3 can be removed from the housing part 1 in particular with the aid of a helical compression spring or the like. The interior of the housing part 1 is thus accessible and it is possible to take out the batteries, for example, accommodated inside.

The housing bottom 3 has an outer bottom 4 (outer wall section) and an inner bottom 5 (inner wall section). The outer bottom 4 is arranged so as to be approximately flush with the free end of the housing part 1, forming an outer surface of the housing part 1 and the housing. The inner bottom 5 is positioned on that side of the housing part 1 facing the interior.

The outer contour of the outer bottom 4 is of an approximately oval configuration corresponding essentially to the oval inner contour of the opening 2. Disposed between the outer bottom 4 and the housing part 1 is an elastomer seal 6 which either is inserted between the components identified or is molded to one said components by a two-component injection molding process.

The outer bottom 4 has a circular opening 7 at roughly the point of intersection of the longest and the shortest dimension of the approximately oval area formed by the outer bottom 4. The inner bottom 5 extends with a circular projection 8 into this opening 7. The outer contour of the projection 8 essentially matches the inner contour of the opening 7. Arranged between the outer bottom 4 and the projection 8 of the inner bottom 5 is an elastomer seal 9 which either is inserted between the components identified or is molded to one of said components by a two-component injection molding process.

The inner bottom 5 is rotatably mounted with its projection 8 in the opening 7 and hence in the outer bottom 4. The axis of rotation is arranged approximately parallel to the longitudinal direction of the housing part 1. The outer bottom 4 is displaceable together with the inner bottom 5 in longitudinal direction inside the housing part 1. In particular it is possible for the outer bottom 4 to be detached together with the inner bottom 5 from the housing part 1 for removal. Similarly, the inner bottom 5 with its projection 8 is displaceable in longitudinal direction in the opening 7 of the outer bottom 4.

The inner bottom 5 has two arms 10 that are arranged approximately transverse to the longitudinal direction of the housing part 1 and in approximately opposite directions and which extend towards those inner walls of the housing part 1 that are spaced a smaller relative distance. These inner walls contain two cutouts 11 extending to the outside and cooperating with the two arms 10. The arms 10 and the cutouts 11 are constructed so that in the closed state each of the arms 10 engages in its corresponding cutout 11, establishing a positive engagement relationship therewith. In this way the inner bottom 5 is securely connected to the housing part 1 in the closed state.

In addition to this, the inner bottom has two arms 12 that are arranged approximately transverse to the longitudinal direction of the housing part 1 and in approximately opposite directions and which extend towards those inner walls of the housing part 1 that are spaced a greater relative distance. Projecting into the interior of the housing part 1 from the outer bottom 4 are two essentially U-shaped frames 13 which cooperate with the two arms 12. The arms 12 and the frames 13 are constructed so that in the closed state each of the arms 12 engages in its corresponding frame 13, establishing a positive-engagement relationship therewith. In this way the outer bottom 4 is securely connected to the inner bottom 5 and hence similarly securely to the housing part 1 in the closed state.

The four arms 10 and 12 are arranged in alternation at an angle of about 90 degrees to each other. The respective cutouts 11 and frames 13 are constructed so that the arms 10, 12 can pass from the described closed state into the open state. In the open state the arms 10 lie outside the cutouts 11 and the arms 12 lie outside the frames 13. The closed state is shown in particular in FIG. 4 and the open state in FIG. 7.

A slot 14 is formed on the outside of the projection 8 of the inner bottom 5 emerging through the opening 7. A coin or the like can be inserted in this slot 14 and be used to turn the inner bottom 5 through an angle of about 45 degrees from the open state into the closed state and vice versa. It will be appreciated that profiles of some other shape can also be used instead of the slot 14.

One of the arms 10 of the inner bottom 5 is provided with a nose 15 for cooperation with a groove 16 provided in the corresponding cutout 11 of the housing part 1. In the closed state the nose 15 engages in the groove 16. The inner bottom 5 is thus locked in the closed state. It will be understood, of course, that it is also possible for both arms 10 to be equipped with such noses 15 and corresponding grooves 16 and/or for the arms 12 and frames 13 to be equipped with locking means of this type.

On the outside of the housing part 1 the cutouts 11 are covered with an elastomer layer 17 which is joined to the housing part 1 in a two-component injection molding process, for example. The elastomer layer 17 improves the grip of the housing part 1. It will be understood that it is also possible to substitute outwardly closed recesses in the inner wall of the housing part 1 for the cutouts 11.

We claim:

1. An electric appliance housing, comprising
   a housing portion having a noncircular cross-section closed by a detachable housing wall section,
   wherein said housing wall section comprises an outer wall section having an aperture and an inner wall section rotatably mounted in the outer wall section, wherein a portion of the inner wall is accessible through the aperture in the outer wall section and is rotatable by a user from a region external said outer wall section when said housing wall section is in an attached condition to the housing portion.

2. The housing of claim 1, wherein the outer wall section has an outer peripheral contour having a shape corresponding to an inner contour of said housing portion.

3. The housing of claim 1, wherein the outer wall section has a circular opening into which the inner wall section extends, and the inner wall section has an outer contour portion having a shape corresponding to an inner contour of said circular opening.

4. The housing of claim 1, wherein in a closed condition the inner wall section, the housing portion, and the outer wall section are interengaged.

5. The housing of claim 4, wherein the inner wall section comprises at least one arm cooperating with a recess on an interior of the housing portion into which the arm engages in the closed condition.

6. The housing of claim 5, wherein the housing portion further comprises an elastomeric layer formed on an exterior surface thereof in register with the recess, the layer being joined to the housing portion in a two-component injection molding process.

7. The housing of claim 4, wherein the inner wall section comprises at least one arm cooperating with a frame disposed on the outer wall section into which the arm engages in the closed condition.

8. The housing of claim 1, wherein the inner wall section and the housing portion comprise a respective latching structure and cooperating latch-receiving region.

9. The housing of claim 8, wherein the latching structure further comprises a protuberance formed on the inner wall section and the latch-receiving region comprises a detent formed on the housing portion.

10. The housing of claim 1, further comprising at least one seal disposed between said outer wall section and at least one of adjacent said housing portion and said inner wall section.

11. The housing as claimed in claim 10, characterized in that said at least one seal is formed between respective components in a two-component injection molding process.

12. The housing of claim 1, wherein the housing wall section forms a major lateral wall of the appliance housing.

13. The housing of claim 1, wherein the inner wall section extends through the outer wall section to an external surface thereof.

14. The housing of claim 1, wherein the inner wall section define s on a surface accessible through the outer wall section a gripping feature to facilitate manipulation of the inner wall.

15. The housing of claim 1, wherein the inner wall section is fixedly rotatably mounted to the outer wall.

16. A housing for an electric appliance, comprising p1 a housing portion defining a cavity therein and an aperture communicating with said cavity,
a detachable wall section detachably mountable by a user within the aperture to the housing portion, said detachable wall section comprising
an outer wall portion in register with the aperture for occluding the aperture, and
an inner wall portion movably mounted to the outer wall portion,
whereby the outer wall portion is retained to the housing portion upon a user moving the inner wall portion relative to the housing portion and the outer wall portion.

17. The housing of claim 16, wherein the inner wall portion is movable between a first position permitting mounting of the outer wall portion and a second position blocking detachment of the outer wall portion.

18. The housing of claim 16, wherein the inner wall portion and the housing portion further comprise thereon first and second cooperating latch structure, the inner wall portion being movable to a latching position to retain the outer wall portion to the housing portion.

19. The housing of claim 18, wherein the first latch structure comprises at least one arm extending from the inner wall portion and the second latch structure comprises latch-receiving structure formed on the housing portion and having at least one recess into which the arm is movable.

20. The housing of claim 16, wherein the inner wall portion is rotationally mounted to the outer wall portion.

21. The housing of claim 16, wherein the aperture is noncircular.

22. The housing of claim 21, wherein the aperture substantially intersects an oval.

23. The housing of claim 21, wherein the aperture is symmetric about a dividing line through the aperture.

24. The housing of claim 16, wherein the outer wall portion is non-rotatably received in the aperture.

25. The housing of claim 16, wherein the outer wall portion has an exterior shape such that the detachable wall section in mounted condition continues an exterior surface of the housing portion adjacent the aperture.

26. The housing of claim 16, wherein the detachable wall section further comprises a flexible seal inhibiting entry of moisture or contaminants into the cavity.

27. The housing of claim 16, wherein the cavity in the housing portion is a battery compartment.

28. A method of selectively closing a component-receiving cavity of an electrical appliance housing, comprising the steps of:
defining an aperture in the housing in communication with the cavity,
providing a detachable wall section comprising an outer wall portion and an inner wall portion movably mounted on the outer wall portion,
inserting the outer wall portion into the aperture in register with the housing with the inner wall portion being in a first position,
moving the inner wall portion relative the outer wall portion and the housing from the first position to a second position, and
engaging, while moving, the inner wall portion with the housing,
thereby sealing the component-receiving cavity with the detachable wall section.

29. The method of claim 28, wherein the engaging step further includes latching the inner wall portion to the housing.

30. The method of claim 28, wherein the moving step comprises rotating the inner wall portion.

31. The method of claim 28, wherein the cavity farther defines a compartment accommodating at least one component in electrical communication with the electric appliance.

32. The method of claim 31, wherein the component accommodated is a battery.

33. The method of claim 28, comprising the further steps of
subsequently moving the inner wall portion from the second position to disengage the inner wall portion from the housing,
removing the detachable wall section from the housing, and
accessing the component-receiving cavity.

34. An electric appliance housing, comprising
a housing portion having a noncircular cross-section closed by a detachable housing wall section, wherein said housing wall section comprises an outer wall section and an inner wall section rotatably mounted in the outer wall section, and wherein in a closed condition the inner wall section, the housing portion, and the outer wall section are interengaged.

35. The housing of claim 34, wherein the inner wall section comprises at least one arm cooperating with a recess on an interior of the housing portion into which the arm engages in the closed condition.

36. The housing of claim 34, wherein the inner wall section comprises at least one arm cooperating with a frame disposed on the outer wall section into which the arm engages in the closed condition.

37. The housing of claim 35, wherein the housing portion further comprises an elastomeric layer formed on an exterior surface thereof in register with the recess, the layer being joined to the housing portion in a two-component injection molding process.

38. An electric appliance housing, comprising a housing portion having a noncircular cross-section closed by a detachable housing wall section, wherein said housing wall section comprises an outer wall section and an inner wall section rotatably mounted in the outer wall section, and wherein the inner wall section and the housing portion comprise a respective latching structure and cooperating latch-receiving region.

39. The housing of claim 38, wherein the latching structure further comprises a protuberance formed on the inner wall section and the latch-receiving region comprises a detent formed on the housing portion.

* * * * *